United States Patent
Lavergne et al.

(10) Patent No.: US 7,289,337 B2
(45) Date of Patent: Oct. 30, 2007

(54) ELECTRONIC CARD WITH BRACED STRUCTURE

(75) Inventors: Catherine Lavergne, Talence (FR); Mathieu Casagrande, Cenon (FR)

(73) Assignee: Thales, Neuilly-sur Seine (FR)

( * ) Notice: Subject to any disclaimer, the term of this patent is extended or adjusted under 35 U.S.C. 154(b) by 138 days.

(21) Appl. No.: 10/538,058

(22) PCT Filed: Dec. 10, 2003

(86) PCT No.: PCT/EP03/50973

§ 371 (c)(1),
(2), (4) Date: Jun. 9, 2005

(87) PCT Pub. No.: WO2004/056163

PCT Pub. Date: Jul. 1, 2004

(65) Prior Publication Data

US 2006/0077641 A1    Apr. 13, 2006

(30) Foreign Application Priority Data

Dec. 13, 2002  (FR) ................................ 02 15844

(51) Int. Cl.
  *H05K 1/18* (2006.01)
  *H05K 7/12* (2006.01)
(52) U.S. Cl. ...................... 361/804; 361/742; 361/770; 361/758
(58) Field of Classification Search ................ 361/829, 361/742, 758, 770, 804, 807, 810, 812
See application file for complete search history.

(56) References Cited

U.S. PATENT DOCUMENTS

| 4,386,390 A | * | 5/1983 | Hammond | ................. 361/804 |
| 4,452,359 A | * | 6/1984 | Koppensteiner | ......... 211/41.17 |
| 4,487,300 A | * | 12/1984 | Hammond | ................... 188/378 |
| 4,533,978 A | * | 8/1985 | Walter | ........................ 361/809 |
| 4,988,577 A | * | 1/1991 | Jamieson | ................... 428/573 |
| 5,136,470 A | * | 8/1992 | Sheridon et al. | ............ 361/749 |
| 5,186,377 A | * | 2/1993 | Rawson et al. | ............... 228/37 |
| 5,198,279 A | * | 3/1993 | Beinhaur et al. | ............. 428/99 |
| 5,748,451 A | * | 5/1998 | Thompson et al. | ......... 361/788 |
| 5,893,466 A | * | 4/1999 | May et al. | ............... 211/41.17 |
| 6,084,182 A | * | 7/2000 | Rehlander | .................... 174/250 |
| 6,122,815 A | * | 9/2000 | Kownacki et al. | ......... 29/426.1 |
| 6,260,245 B1 | * | 7/2001 | Marsetti | ....................... 24/658 |

(Continued)

FOREIGN PATENT DOCUMENTS

EP    0 200 597 A    11/1986

*Primary Examiner*—Dean A. Reichard
*Assistant Examiner*—Dameon E. Levi
(74) *Attorney, Agent, or Firm*—Lowe Hauptman Ham & Berner, LLP (57) ABSTRACT

The field of the invention is that of electronic computers that have to operate in a harsh mechanical environment. One of the main fields of application relates to computers for on-board fixed-wing and rotary-wing aircraft avionics systems operating in a highly vibratory environment. These computers generally comprise one or more large electronic cards. To limit the effects of vibrations on the integrity of the electronic components and on the connection system for the card, the invention proposes to place on each face braced structures for reducing the mechanical effects of the vibrations or for shifting the resonant frequencies of the electronic cards so as to avoid high-Q effects.

12 Claims, 6 Drawing Sheets

U.S. PATENT DOCUMENTS

| | | | |
|---|---|---|---|
| 6,260,265 B1 * | 7/2001 | Kownacki et al. | 29/846 |
| 6,512,676 B1 * | 1/2003 | Crapisi et al. | 361/752 |
| 6,512,678 B2 * | 1/2003 | Sims et al. | 361/759 |
| 6,771,517 B2 * | 8/2004 | Crapisi et al. | 361/829 |
| 6,880,243 B2 * | 4/2005 | Ireland | 211/41.17 |
| 6,943,292 B2 * | 9/2005 | Dingman | 174/535 |
| 7,045,890 B2 * | 5/2006 | Xie et al. | 257/706 |
| 7,161,238 B2 * | 1/2007 | Hsieh et al. | 257/704 |
| 2002/0141165 A1 | 10/2002 | Eckblad et al. | |
| 2004/0124517 A1 * | 7/2004 | Hsieh et al. | 257/686 |

\* cited by examiner

Section on AA

Section on AA

ELECTRONIC CARD WITH BRACED STRUCTURE

CROSS-REFERENCE TO RELATED APPLICATIONS

The present Application is based on International Application No. PCT/EP2003/050973, filed on Dec. 10, 2003, which in turn corresponds to FR 02/15844 filed on Dec. 13, 2002, and priority is hereby claimed under 35 USC § 119 based on these applications. Each of these applications are hereby incorporated by reference in their entirety into the present application.

FIELD OF THE INVENTION

The field of the invention is that of electronic computers that have to operate in a harsh mechanical environment. One of the main fields of application relates to computers for on-board fixed-wing and rotary-wing aircraft avionics systems operating in a highly vibratory environment.

DESCRIPTION OF THE PRIOR ART

Figure 1:
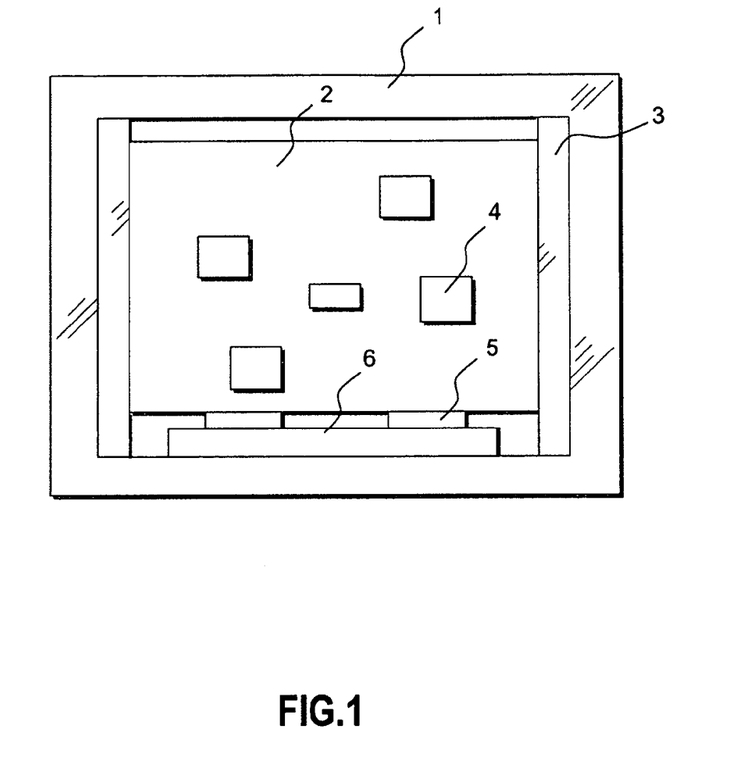
FIG. 1 shows a block diagram of an electronic computer.

FIG. 1 shows a simplified diagram of an electronic computer. It essentially comprises a support frame 1 and one or more electronic cards 2. Each electronic card 2 is mechanically held in the place in the frame 1 by slideways 3. The electrical connection of each electronic card 2 is made by means of one or more connectors 5 that are connected to a common electronic card 6 called a motherboard card or "backplane" card. Each electronic card comprises a printed circuit and electronic components 4.

For some applications, this type of equipment is subjected to harsh mechanical environments. In aeronautic use, the vibration levels may be very high, in particular for certain types of aircraft such as war planes or rotary-wing aircraft, and also in certain regions of the machine, such as jet engines or propulsion turbines.

These vibration levels generate high mechanical stresses in the electronic cards, which may have serious consequences for their operation. The main problems are:
 the integrity of the soldered joints of the components. Certain large components such as high-capacitance capacitors are particularly sensitive to vibrations;
 the integrity of the connection leads for the components. Certain components, such as microprocessors, nonprogrammable electronic components of the ASIC (Application Specific Integrated Circuit) type or programmable electronic components of the EPLD (Erasable Programmable Logic Device) type, have a large number of very small connection outputs that make them more vulnerable to vibrations;
 possible shocks. When an electronic card is subjected to vibrations, most particularly if it is large, it may deform sufficiently to strike either another card or the walls of the support frame itself; and
 possible wear of the connection system. The interconnection pins and contacts of the connectors of the card that are subjected to the vibrations of the card will rub in their housings, possibly causing false contacts or changes in their electrical property.

These phenomena may be further amplified when the natural resonant frequencies of the card correspond to the natural frequencies of the supporting structure of the support frame or to certain frequencies typical of the aircraft (frequencies associated with the rotation of the rotor in the case of a rotary-wing aircraft, frequencies associated with gun-firing flight in the case of military aircraft, etc.).

Figure 2:
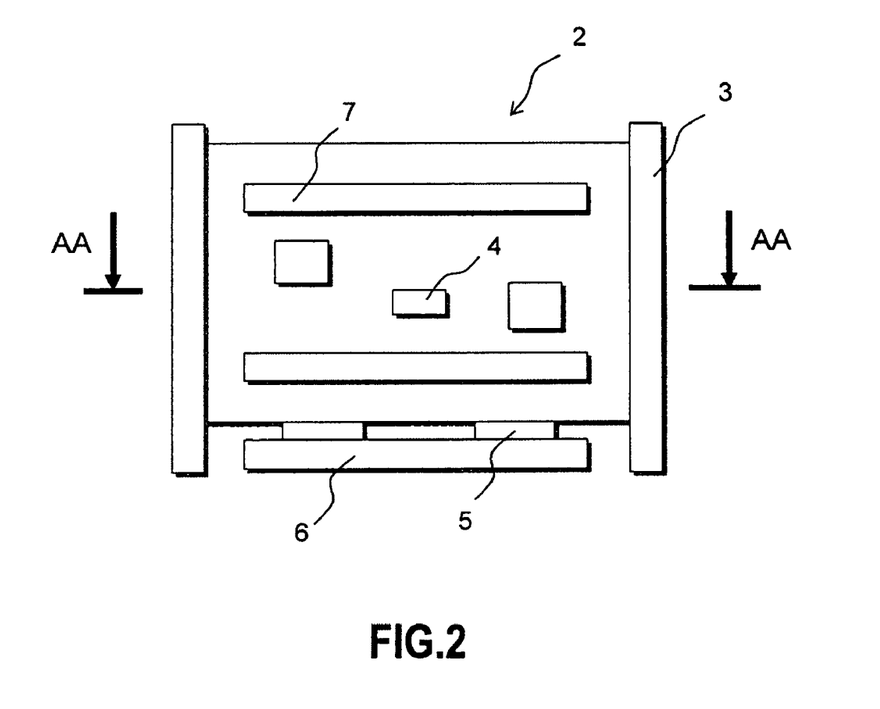
FIGS. 2 and 3 show a front view and a sectional view of an electronic card that includes mechanical stiffeners according to the prior art.
Figure 3:
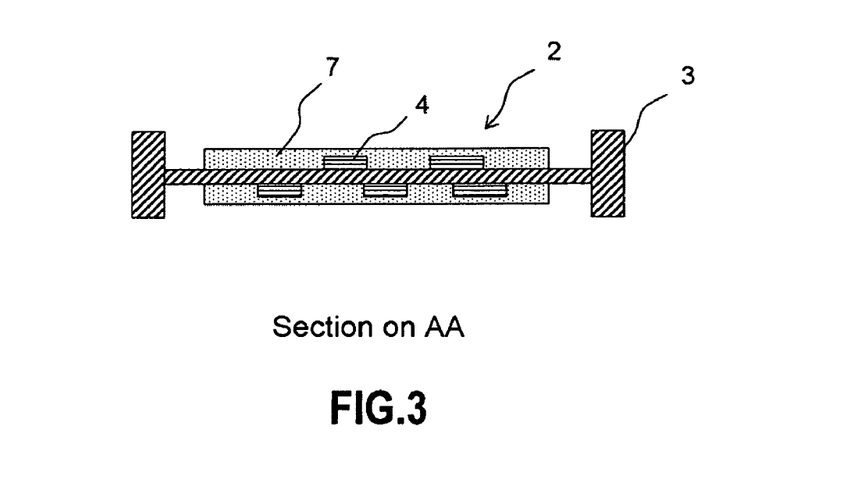

To reduce the problems due to vibration, stiffeners 7 are mounted on the electronic cards as indicated in FIG. 2 where two parallel stiffeners are mounted along the length of the electronic card 2. In general, these stiffeners are thick mechanical reinforcements (FIG. 3 - Section on AA).

These reinforcements allow the mechanical perturbations generated by the vibrations to be reduced. However, they have the following drawbacks:
 their mass is not insignificant. Often, the mass constraint is a dimensioning parameter for aeronautical applications;
 the electronic cards generally dissipate substantial thermal power and the casing may also be in a high-temperature environment—the temperature of the electronic card may then be very high (around 100° C.). Now, the lifetime of the components depends directly on their operating temperature. Consequently, the electronic cards are generally cooled. The cooling can be performed either by air or by heat-transfer fluids. The stiffeners then impede the free circulation of the air or heat-transfer fluids around the electronic cards, which impedes their proper cooling;
 the stiffeners have a well-defined shape and necessarily occupy a certain area on the electronic card, thereby correspondingly reducing the options of fitting the electronic components, complicating the construction of the printed circuit and reducing the area occupied by the electronic components; and
 the resonant frequencies of the electronic card cannot be modified simply by the stiffeners.

SUMMARY OF THE INVENTION

The invention consists in replacing the mechanical reinforcements with brace structures which, while still fulfilling the same functions, do not have their drawbacks.

Brace structures are widely used in architecture and in the field of marine construction. They are generally large structures of the order of several meters. The use of braced structures in the electronics field is however novel and provides significant advantages over conventional mechanical stiffeners. This is because the braced structures are, by nature, lightweight suspended structures having a small footprint on the electronic card. It is also possible, by regulating the mechanical tension of the braces, to shift the high-Q frequencies of the electronic card and to move them away from the typical frequencies of the aircraft. Finally, these structures, which are very simple to produce and to implement, are inexpensive and can be easily standardized for a large number of different electronic cards.

More precisely, the subject of the invention is an electronic card having a first face and a second face, said faces including mechanical reinforcements, characterized in that said reinforcements are formed, on the one hand, from a first braced structure placed on the first face and, on the other hand, from a second braced structure placed on the second face of said electronic card.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

BRIEF DESCRIPTION OF THE DRAWINGS

The invention will be more clearly understood and other advantages will appear on reading the following description given by way of nonlimiting example and by means of the appended figures in which.

DETAILED DESCRIPTION OF THE INVENTION

Figure 4:
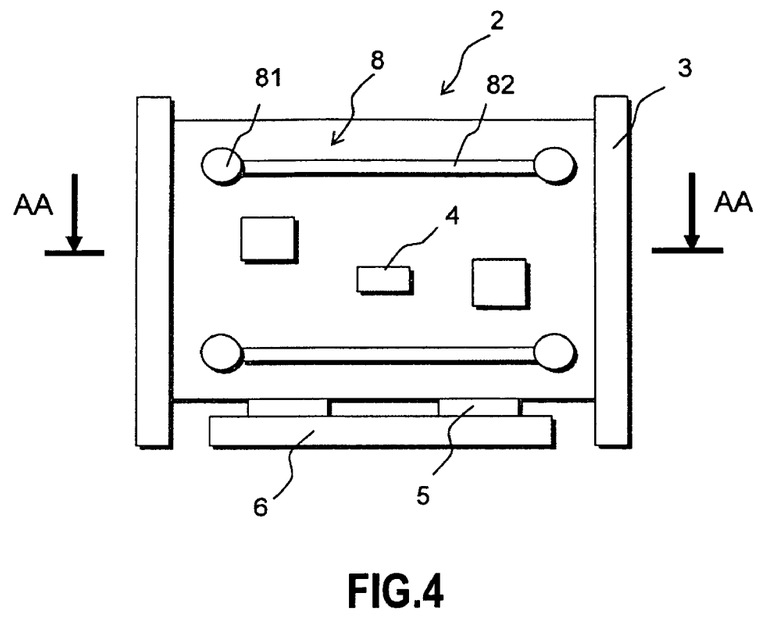
FIGS. 4 and 5 show a front view and a sectional view of an electronic card that includes braced structures according to the invention.

The principle of the invention is illustrated in FIG. 4. First and second braced structures 8 are placed on the first and second faces of an electronic card 2.

Figure 5:
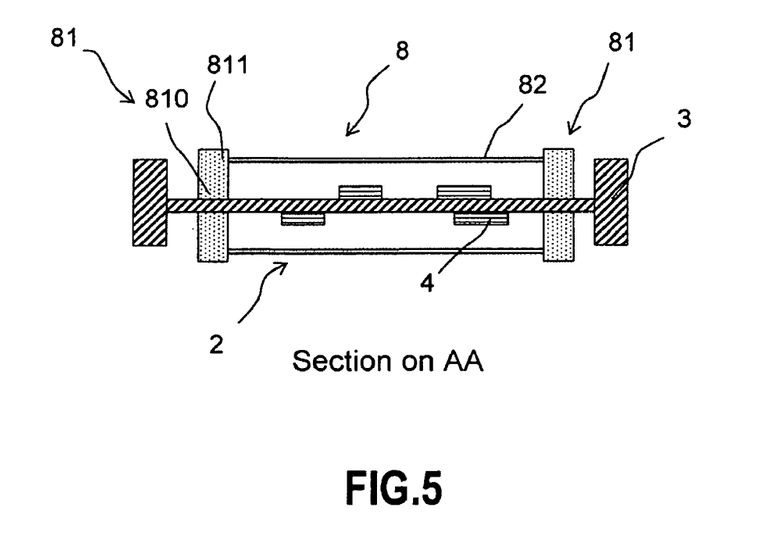

As shown in the section on AA of FIG. 5, each braced structure comprises at least a first peripheral brace support 81, a second peripheral brace support 81 and a brace 82, these being located on the same face of the electronic card, each peripheral brace support having a lower end 810 fastened to said face and an upper end 811, said upper ends 811 of the first and second peripheral braces being joined together by said brace 82.

The operating principle is as follows: the braces are put under mechanical tension so as to impose a mechanical stress on the electronic card. The additional mechanical stresses generated by the vibrations will thus have less of a perturbing effect. In order for these stresses not to cause the electronic card to buckle, it is very important for the stresses provided by the second braced structure to be identical to those provided by the first braced structure. Thus, the resulting stresses lie in the plane of the electronic card. If the arrangement of the card and the fitting of the components so allow, the simplest way of obtaining this effect is to choose a second braced structure identical to the first and to place it on the second face in a substantially identical manner to the first braced structure placed on the first face.

The brace is either a small-diameter metal cable under tension or a thin metal blade also called a "shim", again under tension. Its thickness varies between a few tenths of a millimeter and a few millimeters.

The brace is mechanically tensioned either by means external to the electronic card or by means internal to the braced structure, the mechanical tension in the brace being adjustable by said means. It is very advantageous to have an adjustable tension. This is because the resonant frequencies of an electronic card depend on the stresses that are applied to it. By modifying the mechanical tension in the braces, the resonant frequencies of the card are thus changed so that they are different from the natural frequencies of the structure or of the aircraft. Thus, the high-Q effects are avoided. The frequency shift may be up to several tens of percent of the initial resonant frequency obtained in the absence of applied mechanical tensions.

When the means of tensioning the braces form an integral part of the braced structure, they are of two possible types:

type 1: the means for tensioning the brace of the second structure are independent of the means for tensioning the brace of the first structure; and type 2: the mechanical tensioning means are common to the braces of each braced structure.

Figure 6:
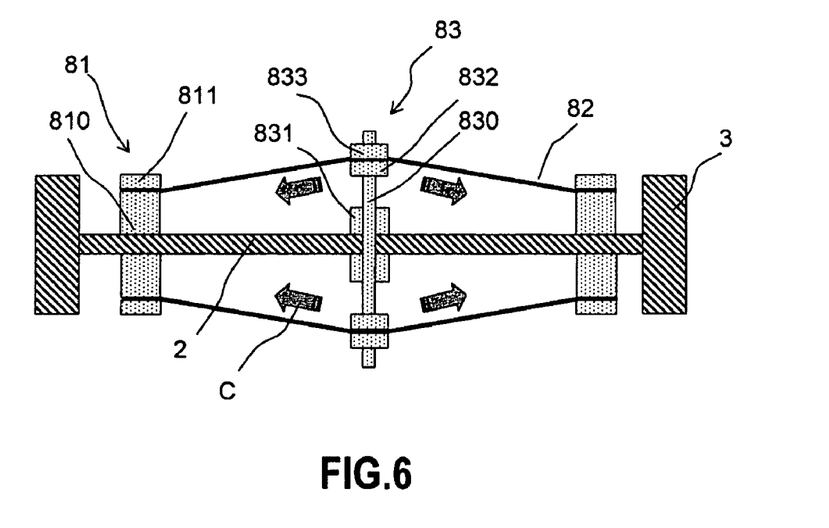
FIGS. 6 and 7 show two cross-sectional views of braced structures according to a first embodiment.
Figure 7:
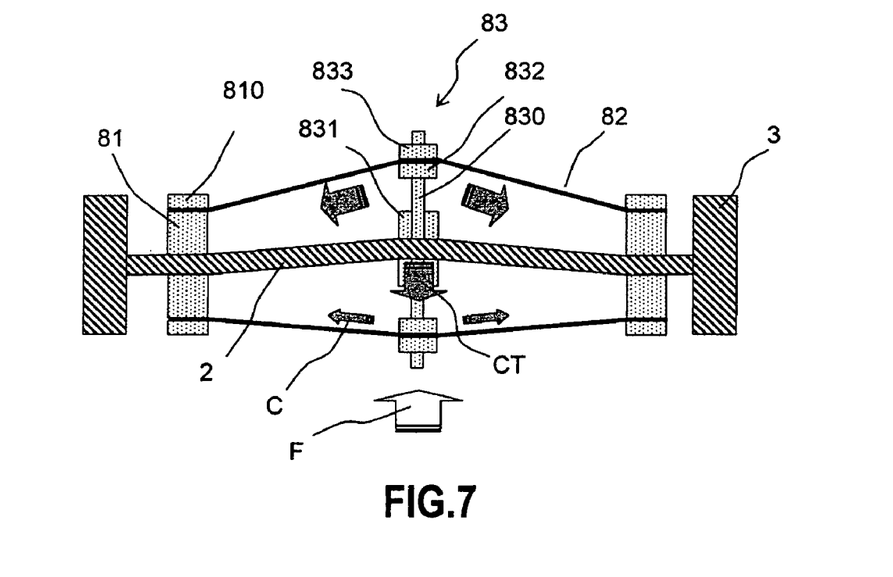

FIGS. 6 and 7 show two cross-sectional views of an example of a type-1 braced structure. FIG. 6 shows a cross-sectional view of the structure at rest. FIG. 7 shows a cross-sectional view of the same structure when it is subjected to a mechanical stress.

The hatched part of FIG. 6 shows a cross-sectional view of the electronic card 2 and of its two support slideways 3. A braced structure 8 is mounted on each face of the electronic card. Each braced structure comprises:

a brace 82, which is either a metal cable or a metal blade;

two peripheral brace supports 81 comprising mechanical parts 811 that allow the brace 82 to be fastened to these two ends; and a mechanical tensioning assembly comprising:

a central mast 830 perpendicular to the electronic card, the lower end of said mast being fastened to the electronic card by means of a mechanical part 831. For the sake of simplification and to stiffen the structure, the central mast of each braced structure may be a single structure common to both faces, as indicated in FIG. 4a. It then passes through the electronic card 2; and a mechanical assembly comprising the parts 832 and 833. The brace 82 is fastened to the part 832, which can move translationally along the axis of the mast, and the mechanical part 833 blocks the brace 82 and the part 832. Advantageously, to perform the translation and blocking functions, the mast has a threaded portion and the mechanical parts 832 and 833 constitute a nut/jam-nut assembly.

The brace 82 is mechanically tensioned in the following manner. The mechanical part 832 is displaced, which entrains the central portion of the brace and creates mechanical stresses C (the gray arrows in FIG. 6) in the brace. These stresses are transmitted to the electronic card by means of the brace supports 81. The further away the mechanical part 832 is from the electronic card, the higher the stresses applied. When the desired stress is obtained, the part 832 is blocked by means of the part 833. The stresses are adjusted on the first and second braced structures so that the stresses applied to the first and second faces are equivalent.

FIG. 7 illustrates the dynamic operation of the braced structures. When the card is in a vibratory environment, it is subjected to periodic forces that tend to deform it. FIG. 7 shows the electronic card of FIG. 6 deformed under the action of a force F. The deformation of the card causes a reduction in the stresses in the brace of one of the two structures and an increase in the stresses in the brace of the opposite braced structure. The resultant of the stresses CT is no longer zero in a plane perpendicular to the plane of the electronic card and it opposes the action of the applied force F, thus reducing its effect.

When the braced structures have independent tensioning means, the stresses applied to the braces must be perfectly controlled so as not to induce parasitic stresses on the electronic card. By using common tensioning means, this difficulty is resolved. This is because, in this case, the applied stresses will be naturally distributed symmetrically over the braces of the first and second braced structures.

Figure 8:
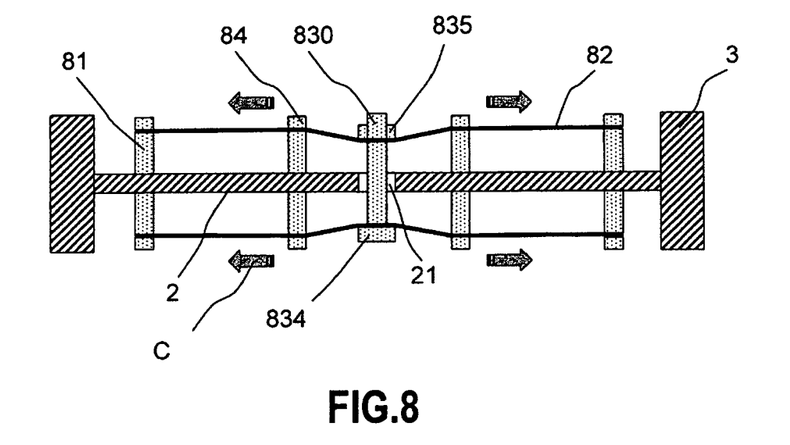
FIGS. 8 and 9 show two cross-sectional views of braced structures according to a second embodiment.
Figure 9:
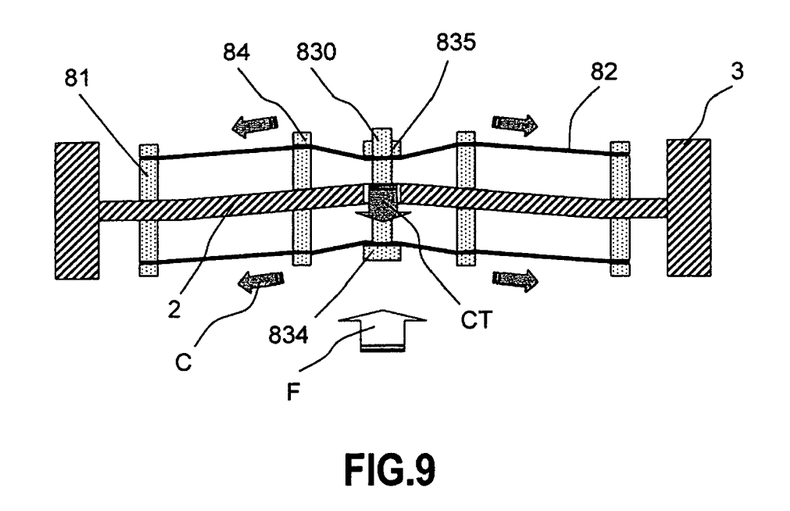

FIGS. 8 and 9 show two cross-sectional views of an example of a type-2 braced structure. FIG. 8 shows a cross-sectional view of the structure at rest. FIG. 9 shows a cross-sectional view of the same structure when it is subjected to a mechanical stress.

The hatched part of FIG. 8 shows a cross-sectional view of the electronic card 2 and of its two support slideways 3. A braced structure 8 is mounted on each face of the electronic card. Each braced structure comprises:

- a brace 82, which is either a metal cable or a metal blade;
- two peripheral brace supports 81, comprising mechanical parts 810 for fastening the brace 82 to these two ends;
- a central mast 830 passing freely through the electronic card, via the opening 21, and having first and second ends;
  - the first end of said mast being located on the same side as the first face, the brace of the first structure being fastened to said first end by means of a mechanical part 834; and
  - the second end being located on the same side as the second face, the second end carrying a mechanical assembly 835 fastened to the brace of the second structure, said mechanical assembly comprising means for translationally adjusting the brace along the central mast and for fixing it thereto, the central portion of the brace 82 of the second structure being fastened to said mechanical assembly;
- at least two central brace supports 84 located on the first face, these being placed on either side of the central mast 830, each brace support having a lower end, fastened to said first face, and an upper end, the base 82 of the first braced structure resting on said upper ends of said central brace supports 84; and
- at least two central brace supports 84 located on the second face, these being placed on either side of the central mast 830, each brace support having an upper end, fastened to said second face, and an upper end, the brace 82 of the second braced structure resting on said upper ends of said central brace supports 84.

The brace 82 is mechanically tensioned in the following manner. The mechanical part 835 is displaced, which simultaneously entrains the central portions of the braces of the first and second structures and creates identical mechanical stresses C (the gray arrows in FIG. 8) on each brace. These stresses are transmitted to the electronic card by means of the brace supports 81. The closer the mechanical part 835 is to the mechanical part 834, the higher the stresses applied. When the desired stress is obtained, the part 835 is blocked.

FIG. 9 shows the dynamic operation of this type of braced structure. When the card is in a vibratory environment, it is subjected to periodic forces that tend to deform it. FIG. 9 shows the electronic card of FIG. 8 deformed under the action of a force F. The deformation of the card simultaneously increases the stresses in the braces of the two braced structures. The resultant of the stresses CT is no longer zero in a plane perpendicular to the plane of the electronic card and it opposes the action of the applied force F, thus reducing its effect.

Figure 10:
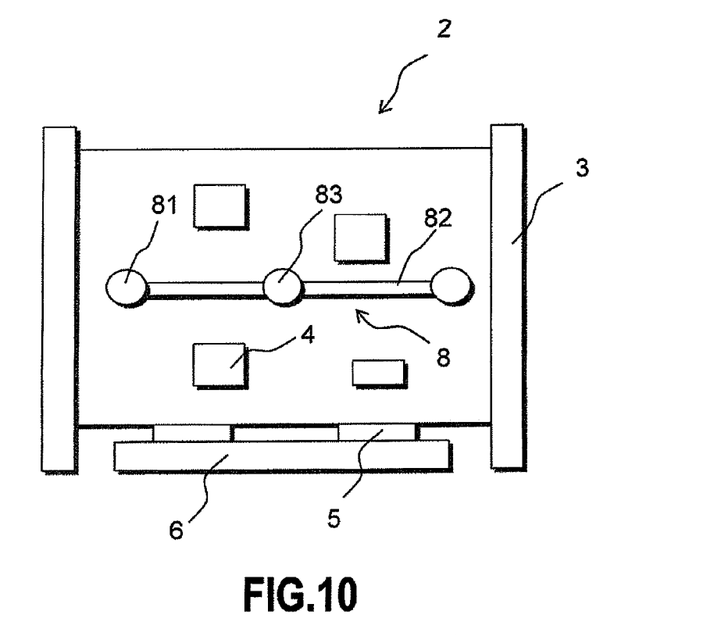
FIG. 10 shows a first configuration of a braced structure according to the invention.

The braced structures may be fitted at the center of the card parallel to these edges as indicated in FIG. 10.

Figure 11:
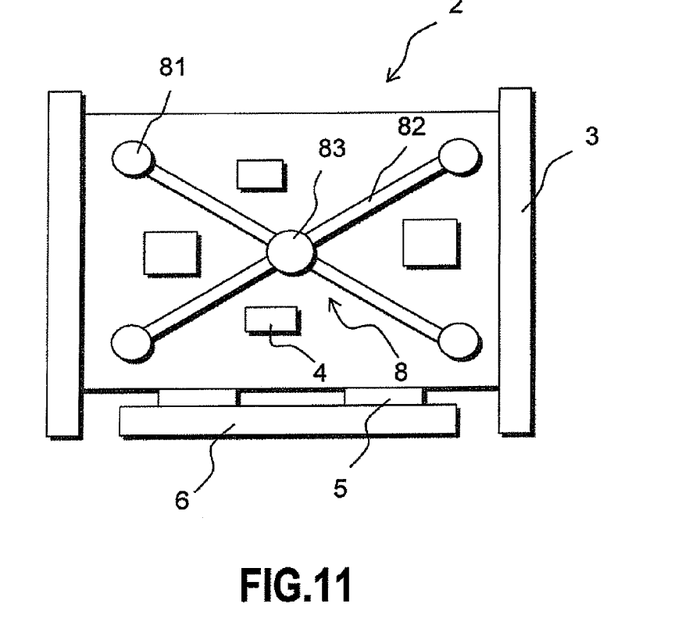
FIG. 11 shows a second configuration of a braced structure according to the invention.

They may also be fitted as indicated in FIG. 11. In this case, each braced structure comprises four brace supports placed approximately in the form of a rectangle and two braces, each brace joining two brace supports located on one of the two diagonals of the rectangle. The mechanical tensioning means are then common to the braces of each braced structure.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

What is claimed is:

1. An electronic card comprising:
   a first face and a second face, said faces including mechanical reinforcements formed from a first braced structure placed on the first face and from a second braced structure placed on the second face of said electronic card, each braced structure comprises a brace formed by a small diameter metal cable or thin metal blade and means for mechanically tensioning the brace, wherein the means for mechanically tensioning are common to the brace of the second braced structure and to the brace of the first braced structure, and further wherein the common mechanical tensioning means comprise:
   a central mast passing through the electronic card and having a first end and a second end:
   the first end of said mast being located on the same side as the first face, the brace of the first structure being fastened to said first end; and
   the second end being located on the same side as the second face, the second end carrying a mechanical assembly fastened to the brace of the second structure, said mechanical assembly comprising means for translationally adjusting the brace along the central mast and for fixing it thereto, the central portion of the brace of the second structure being fastened to said mechanical assembly;
   at least two central brace supports located on the first face, these being placed on either side of the central mast, each brace support having a lower end, fastened to said first face, and an upper end, the base of the first braced structure resting on said upper ends of said central brace supports; and
   at least two central brace supports located on the second face, these being placed on either side of the central mast, each brace support having a lower end, fastened to said second face, and an upper end, the brace of the second braced structure resting on said upper ends of said central brace supports.

2. The electronic card as claimed in claim 1, wherein the second braced structure is substantially identical to the first braced structure.

3. The electronic card as claimed in claim 2, wherein the second braced structure is placed on the second face in a substantially identical manner to the first braced structure placed on the first face.

4. The electronic card as claimed in claim 1, wherein each braced structure comprises at least a first peripheral brace support, a second peripheral brace support and a brace, these being located on the same face of the electronic card, each peripheral brace support having a lower end fastened to said face and an upper end, said upper ends of the first and second peripheral brace supports being joined together by said brace.

5. The electronic card as claimed in claim 4, wherein each braced structure comprises four brace supports spaced approximately in the form of a rectangle and two braces, each brace joining two base supports located on one of the two diagonals of the rectangle.

6. The electronic card as claimed in claims 5, wherein the mechanical tensioning means are common to the braces of each braced structure.

7. The electronic card according to claim 1, wherein the means for tensioning the brace of the second structure are independent of the means for tensioning the brace of the first structure.

8. The electronic card as claimed in claim 7, wherein the means for mechanically tensioning each braced structure comprise a central mast located between the first peripheral brace support and the second peripheral brace support, the two peripheral brace supports and the central mast being located on the same face of the electronic card, said central mast being approximately perpendicular to said face, said central mast having a lower end, fastened to the electronic card, and an upper end carrying a mechanical assembly comprising means for translationally adjusting the brace along the central mast and for fixing it thereto, the central portion of the brace of said braced structure being fastened to said mechanical assembly.

9. The electronic card as claimed in claim 8, wherein the central mast has a threaded portion and in that the mechanical assembly is of the nut/jam-nut type.

10. The electronic card as claimed in claim 1, wherein the central mast has a threaded portion and in that the mechanical assembly is essentially a nut.

11. An electronic computer that includes at least one electronic card as claimed in claim 1.

12. A fixed-wing or rotary-wing aircraft avionics system that includes at least one electronic computer as claimed in claim 11.

* * * * *